US 8,866,506 B2

(12) United States Patent
Mochizuki

(10) Patent No.: US 8,866,506 B2
(45) Date of Patent: Oct. 21, 2014

(54) CONTACT STRUCTURE FOR INSPECTION

(75) Inventor: Jun Mochizuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 385 days.

(21) Appl. No.: 12/999,375

(22) PCT Filed: Jun. 17, 2009

(86) PCT No.: PCT/JP2009/061003
§ 371 (c)(1),
(2), (4) Date: Dec. 16, 2010

(87) PCT Pub. No.: WO2009/154217
PCT Pub. Date: Dec. 23, 2009

(65) Prior Publication Data
US 2011/0121846 A1    May 26, 2011

(30) Foreign Application Priority Data

Jun. 20, 2008   (JP) ................... 2008-161559

(51) Int. Cl.
*G01R 31/20* (2006.01)
*G01R 1/073* (2006.01)
*G01R 1/067* (2006.01)

(52) U.S. Cl.
CPC ........ *G01R 1/07371* (2013.01); *G01R 1/06772* (2013.01)
USPC ...... 324/754.03; 324/447; 324/448; 324/537; 324/724; 324/754.01

(58) Field of Classification Search
CPC .................................................. H01L 2224/97
USPC .................... 324/754.03, 447, 448, 537, 724, 324/754.01, 757
See application file for complete search history.

(56) References Cited

U.S. PATENT DOCUMENTS 5,357,138 A * 10/1994 Kobayashi ..................... 257/664
5,406,211 A *  4/1995 Inoue et al. ............... 324/750.05
(Continued)

FOREIGN PATENT DOCUMENTS

JP      02-216467      8/1990
JP      5-55553        7/1993
(Continued)

OTHER PUBLICATIONS

Albu, "Wiring Technique for Microstrip Circuits", IPCOM000034835D, Jan. 2005, pp. 1-2.*
International Search Report for PCT/JP2009/061003 mailed on Jul. 14, 2009.
(Continued)

*Primary Examiner* — Huy Q Phan
*Assistant Examiner* — Giovanni Astacio-Oquendo
(74) *Attorney, Agent, or Firm* — Pearne & Gordon LLP

(57) ABSTRACT

A contact structure for inspection that is installed on a bottom surface of a circuit board includes a ground conductor that is grounded; an elastic contact member that is brought into contact with an inspection target object; and a conductive line that electrically connects the circuit board and the elastic contact member. Here, the elastic contact member may be provided on a bottom surface of the ground conductor that is grounded. The elastic contact member may include an insulating layer, a wiring layer, a contactor and an elastic body provided at a position corresponding to the contactor. The elastic body provides the elastic contact member with elasticity when the contactor is brought into contact with an electrode. The elastic contact member is provided in parallel with the ground conductor. The wiring layer and the ground conductor form a microstrip line.

7 Claims, 3 Drawing Sheets

(56) References Cited

U.S. PATENT DOCUMENTS

| | | | |
|---|---|---|---|
| 6,343,369 B1* | 1/2002 | Saunders et al. | 324/755.01 |
| 6,378,201 B1* | 4/2002 | Tsukada et al. | 29/852 |
| 6,967,557 B2* | 11/2005 | Hagios et al. | 336/200 |
| 2002/0057099 A1 | 5/2002 | Esashi et al. | |
| 2004/0211590 A1* | 10/2004 | Tagi et al. | 174/255 |
| 2005/0184743 A1 | 8/2005 | Kimura | |
| 2006/0250149 A1* | 11/2006 | Lan | 324/754 |
| 2008/0007280 A1* | 1/2008 | Amemiya et al. | 324/754 |
| 2008/0136433 A1* | 6/2008 | Tashiro et al. | 324/757 |
| 2010/0026331 A1* | 2/2010 | Chong et al. | 324/757 |

FOREIGN PATENT DOCUMENTS

| | | |
|---|---|---|
| JP | 07-050324 | 2/1995 |
| JP | 11-352149 | 12/1999 |
| JP | 2001-033486 | 2/2001 |
| JP | 2004-117247 | 4/2004 |
| TW | 520545 | 2/2003 |
| TW | 200533924 | 10/2005 |

OTHER PUBLICATIONS

Korean Office Action for Korean Application No. 10-2010-7028137 mailed on Dec. 28, 2011.

* cited by examiner

CONTACT STRUCTURE FOR INSPECTION

TECHNICAL FIELD

The present invention relates to an inspection contact structure that is provided on a bottom surface of a circuit board and inspects an electrical characteristic of an inspection target object.

BACKGROUND ART

A probe card having a circuit board and probes as contactors is used to inspect an electrical characteristic of a device such as IC (Integrated Circuit) or LSI (Large Scale Integrated Circuit) formed on a semiconductor wafer (hereinafter, simply referred to as a 'wafer'). By way of example, an electrical characteristic inspection is carried out by bringing the probes provided on a bottom surface of the circuit board into contact with electrodes of the device on the wafer.

The electrodes of the device may have different heights. Accordingly, to absorb such a difference in height, the probes need to have a mechanical characteristic called elasticity. Further, the probes also need to have a highly excellent electrical characteristic to minimize a voltage loss.

Thus, conventionally, it has been proposed that the probes be made of a material having a superior electrical characteristic and, also, an elastic body be provided at a position above the probes facing the electrodes of the device to thereby provide the probes with elasticity (see, for example Patent Document 1).

Patent Document 1: Japanese Patent Laid-open Publication No. 2001-033486

DISCLOSURE OF THE INVENTION

Problems to be Solved by the Invention

In the above-described probe card, however, precise impedance matching has not been performed on the probes. Therefore, an electrical signal sent to the probes during the inspection may suffer deterioration of a signal waveform such as deformation of a signal waveform or signal delay due to impedance mismatching, resulting in degrading of inspection accuracy.

In view of the foregoing, the present invention is capable of performing stable electrical characteristic inspection on an inspection target object with high accuracy.

Means for Solving the Problems

In accordance with an embodiment of the present invention, there is provided a contact structure for inspection that is installed on a bottom surface of a circuit board and inspects an electrical characteristic of an inspection target object. The contact structure includes a ground conductor that is grounded; an elastic contact member that is brought into contact with the inspection target object; and a conductive line that electrically connects the circuit board and the elastic contact member. Here, the elastic contact member may be provided on a bottom surface of the ground conductor. The elastic contact member may include a contactor that is brought into contact with the inspection target object, a wiring layer that electrically connects the contactor and the conductive line, an insulating layer that is provided between the wiring layer and the ground conductor, and an elastic body that is provided at a position facing the inspection target object via the contactor. Further, the wiring layer may be provided in parallel with the ground conductor.

In accordance with the present invention, the wiring layer of the contact structure for inspection is arranged in parallel with the ground conductor and forms a microstrip line. Accordingly, by varying a width of the wiring layer and a distance between the wiring layer and the ground conductor, i.e., a thickness of the insulating layer provided between the wiring layer and the ground conductor, a characteristic impedance of the wiring layer can be adjusted. Thus, impedance matching of the entire inspection contact structure including the elastic contact member may be enabled, and, thus, inspection of an electrical characteristic of the inspection target object can be stably carried out with high accuracy. Furthermore, since the elastic body provided at the position corresponding to the contactor provides the elastic contact member with elasticity, the elastic contact member becomes to have elasticity required when it is brought into contact with the inspection target object.

Effect of the Invention

In accordance with the present invention, inspection of an electrical characteristic can be carried out stably on an inspection target object with high accuracy.

EXPLANATION OF CODES

Figure 1:
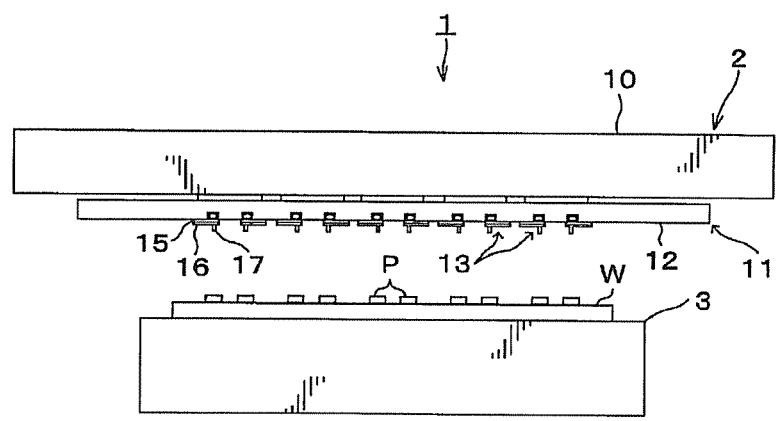
FIG. 1 is a side view illustrating a probe device having an inspection contact structure in accordance with an embodiment of the present invention.

1: Probe device
2: Probe card
3: Mounting table
10: Circuit board
10*a*: Connecting terminal
11: Inspection contact structure
12: Ground conductor
12*a*: Main body
12*b*: Through hole
13: Elastic contact members
14: Conductive line
15: Insulating layer
16: Wiring layer
17: Contactor
18: Elastic body
19: Recess
20: Conductor
21: Insulating layer
40: Elastic contact member
41: Insulating layer
42: Wiring layer
43: Contactor 44: Elastic body
45: Recess
50: Elastic contact member
51: Wiring layer
52: Contactor
53: Elastic body
54: Connecting hole
W: Wafer
P: Inspection target electrode

BEST MODE FOR CARRYING OUT THE INVENTION

Hereinafter, embodiments of the present invention will be described. FIG. 1 is a schematic configuration view illustrating a probe device 1 having an inspection contact structure in accordance with an embodiment of the present invention.

The probe device 1 includes a probe card 2 and a mounting table 3 configured to mount thereon a wafer W as an inspection target object. The probe card 2 has, e.g., a circular plate shape, and includes a circuit board 10 for sending an electrical signal for inspection to the wafer W and an inspection contact structure 11 provided on a bottom surface of the circuit board 10 in parallel with the circuit board 10. The inspection contact structure 11 includes a ground conductor 12 grounded via a non-illustrated wiring and elastic contact members 13. The elastic contact members 13 are provided on a bottom surface of the ground conductor 12.

The mounting table 3 is configured to be movable in left and right directions and up and down directions. The mounting table 3 moves the mounted wafer W in a three dimensional direction, and, thus, the mounting table 3 allows the elastic contact members 13 of the probe card 2 to come into contact with desired positions on the wafer W, i.e., electrodes P of a device.

Figure 2:
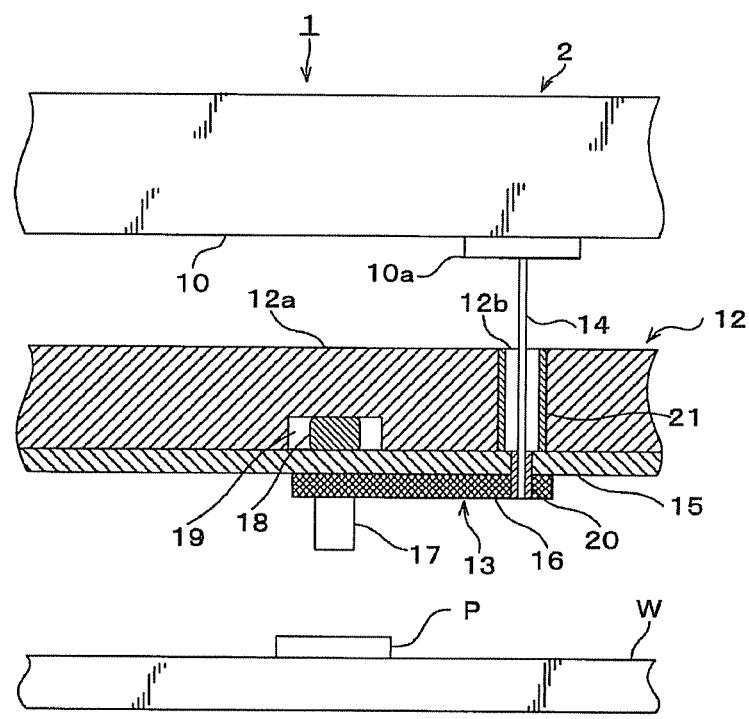
FIG. 2 is a side view illustrating a schematic configuration of the inspection contact structure in accordance with the embodiment of the present invention.

The circuit board 10 is formed in, e.g., a circular plate shape. Embedded in the circuit board 10 is a non-illustrated electronic circuit for transmitting an inspection signal from a non-illustrated tester to the elastic contact members 13. Further, the circuit board 10 has a connecting terminal 10a formed on its bottom surface, as illustrated in FIG. 2.

The ground conductor 12 is formed in, e.g., a rectangular plate shape. By way of example, the ground conductor 12 can be made of a metallic substrate. The ground conductor 12 is provided with a through hole 12b passing through a main body 12a of the ground conductor 12 in a vertical direction. A conductive line 14 electrically connects the circuit board 10 with the elastic contact members 13 through the through hole 12b. Further, the ground conductor 12 can also be made of a conductive ceramic substrate, a conductive glass substrate, or the like.

Figure 3:
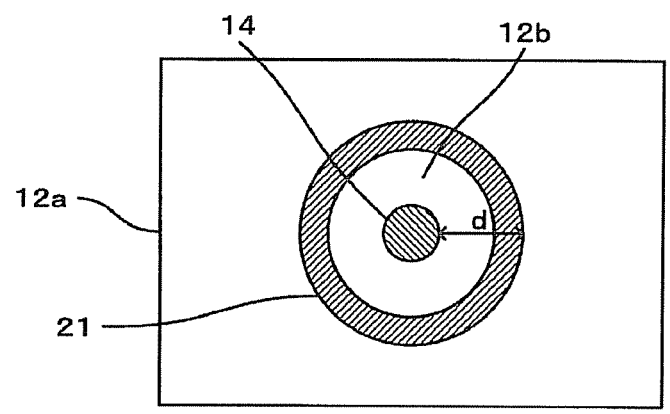
FIG. 3 is a schematic diagram illustrating a coaxial structure of a ground conductor and a conductive line.

The conductive line 14 is accommodated within the through hole 12b and arranged coaxially with the main body 12a, as illustrated in FIG. 3. Accordingly, by varying a distance d between a surface of the conductive line 14 and an inner circumferential surface of the main body 12a, i.e., by varying a diameter of the through hole 12b, a characteristic impedance of the conductive line 14 penetrating the main body 12a can be adjusted.

The conductive line 14 is protruded from a top surface and a bottom surface of the main body 12a of the ground conductor 12. The conductive line 14 is electrically connected with the connecting terminal 10a on a top side of the ground conductor 12, while the conductive line 14 is electrically connected with a wiring layer 16 of an elastic contact member 13 to be described later on a bottom side of the ground conductor 12.

A cylindrical insulating layer 21 is formed on an inner surface of the through hole 12b. The cylindrical insulating layer 21 is extended in a vertical direction of the main body 12a and is in contact with an insulating layer 15 on a bottom surface of the ground conductor 12. In this configuration, the insulating layer 21 insulates the conductive line 14 and the ground conductor 12 from each other. Further, although a thickness of the insulating layer 21 is shown in FIGS. 2 to 5 to be smaller than the distance d between the surface of the conductive line 14 and the inner circumferential surface of the main body 12a, the thickness of the insulating layer 21 may not be limited to the illustrated example but may be varied as required.

The elastic contact member 13 includes the insulating layer 15, the wiring layer 16, a contactor 17 and an elastic body 18. The insulating layer 15 is a sheet-shaped insulator provided on the bottom surface of the ground conductor 12 in parallel with the ground conductor 12. The insulating layer 15 may be made of, e.g., polyimide. The wiring layer 16, which is a sheet-shaped conductor, is provided on a bottom surface of the insulating layer 15 in parallel with the insulating layer 15, i.e., in parallel with the ground conductor 12. The wiring layer 16 is extended to a position directly under the through hole 12b. The wiring layer 16 and the conductive line 14 are electrically connected with each other via a conductor 20. By way of example, the conductor 20 may be made of a conductive adhesive or solder.

The contactor 17 to be brought into contact with an electrode P is provided on a bottom surface of the wiring layer 16 and at a position corresponding to the electrode P. The contactor 17 is electrically connected with the conductive line 14 via the wiring layer 16. The contactor 17 may be made of a material harder than a material of the electrode P of the device. By way of example, the contactor 17 may be made of a conductive metal such as nickel or cobalt having a highly superior mechanical characteristic. A recess 19 is formed in a bottom surface of the ground conductor 12 and at a position facing the electrode P via the contactor 17. The elastic body 18 is provided in the recess 19. The elastic body 18 provides the contactor 17 with elasticity when the contactor 17 comes into contact with the electrode P. In the present embodiment, the elastic body may be made of, e.g., silicon rubber.

The ground conductor 12 and the wiring layer 16 of the elastic contact member 13 form a horizontal microstrip line with the insulating layer 15 sandwiched therebetween. Accordingly, by varying a width of the wiring layer 16 and a distance between the wiring layer 16 and the ground conductor 12, i.e., a thickness of the insulating layer 15, a characteristic impedance of the wiring layer 16 can be adjusted. Thus, impedance matching of the elastic contact member 13 can be carried out. In such a case, impedance matching of the entire probe card including the circuit board 10 and the elastic contact member 13 can be carried out.

In case that an electrical characteristic of a device on a wafer W is inspected by the probe card 2 configured as described above, the mounting table 3 mounting the wafer W thereon is moved and the elastic contact member 13 is allowed to approach the wafer W and the elastic contact member 13 is brought into contact with an electrode P on the device. Then, an electrical signal for inspection is applied from the tester to the device via the circuit board 10 and the elastic contact member 13, so that the electrical characteristic of the device is inspected.

In accordance with the aforementioned embodiment, the wiring layer 16 of the contact structure for inspection 11 is arranged in parallel with the ground conductor 12 and forms the microstrip line. Accordingly, by varying the width of the wiring layer 16 and the distance between the wiring layer 16 and the ground conductor 12, i.e., the thickness of the insulating layer 15, a characteristic impedance of the elastic contact member 13 can be adjusted. Thus, since impedance matching of the inspection contact structure 11 including the elastic contact member 13 can be carried out, stable inspection without deterioration of signal waveform such as deformation of waveform or signal delay can be carried out. Furthermore, since the contactor 17 of the elastic contact member 13 is provided with elasticity by the elastic body 18 placed at a position corresponding to the contactor 17, elasticity necessary when the contactor 17 comes into contact with the electrode P may also be provided.

Furthermore, in accordance with the above-described embodiment, the conductive line 14 is coaxially provided within the through hole 12b of the ground conductor 12 while a distance d is maintained between the conductive line 14 and the main body 12a. Thus, by adjusting the distance d, i.e., by adjusting a diameter of the through hole 12b, a characteristic impedance of the conductive line 14 can also be adjusted. In such a case, impedance matching of the entire probe card including the circuit board 10 and the elastic contact member 13 can be carried out.

Figure 4:
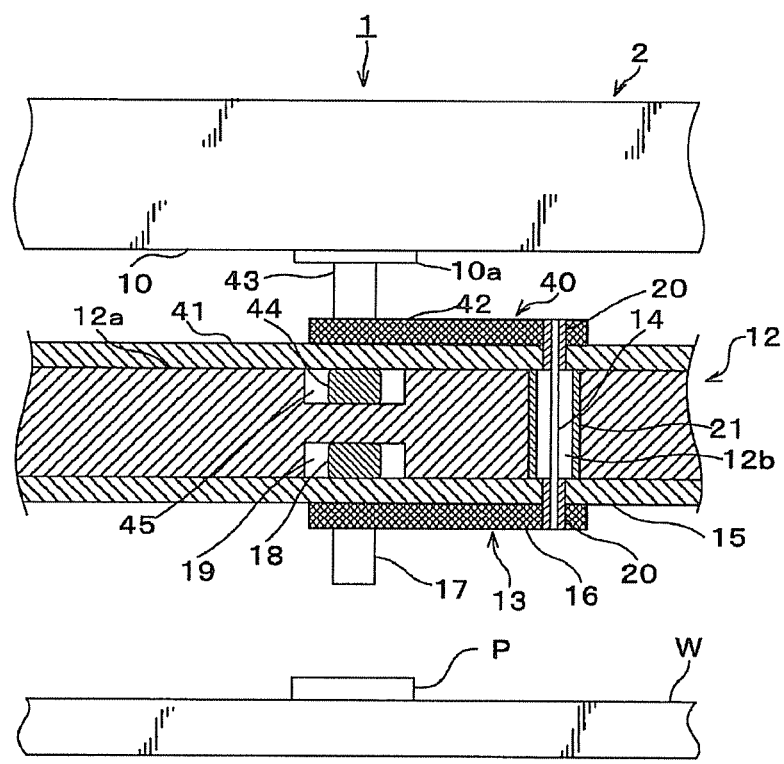
FIG. 4 is a side view illustrating a schematic configuration of an inspection contact structure in accordance with another embodiment of the present invention.

In accordance with the above-described embodiment, although the elastic contact member 13 is provided only on the bottom surface of the ground conductor 12, an elastic contact member 40 having the same configuration as that of the elastic contact member 13 may also be provided on a top surface of the ground conductor 12, as illustrated in FIG. 4. The elastic contact member 40 may include an insulating layer 41, a wiring layer 42, a contactor 43 and an elastic body 44. The insulating layer 41 may be a sheet-shaped insulator provided on the top surface of the ground conductor 12 in parallel with the ground conductor 12.

The wiring layer 42, which is a sheet-shaped conductor, is provided on a top surface of the insulating layer 41 in parallel with the insulating layer 41, i.e., in parallel with the ground conductor 12. The contactor 43 to be brought into contact with the connecting terminal 10a is provided on a top surface of the wiring layer 16 and at a position corresponding to the connecting terminal 10a of the circuit board 10. The contactor 43 is electrically connected with the conductive line 14 via the wiring layer 42. A recess 45 is formed in a top surface of the ground conductor 12 and at a position facing the connecting terminal 10a via the contactor 43. The elastic body 44 is accommodated in the recess 45. The elastic body 44 provides the contactor 43 with elasticity when the contactor 43 comes into contact with the connecting terminal 10a. Further, each of the contactor 43 and the elastic body 44 may be made of the same material as that used to fabricate the elastic contact member 13.

In this configuration, since the elastic contact member 40 also forms a microstrip line like the elastic contact member 13, a characteristic impedance of the wiring layer 42 can be adjusted. Accordingly, a characteristic impedance of a part where a coaxial structure formed by the conductive line 14 and the main body 12a is not formed, i.e., a part where a characteristic impedance of the conductive line 14 cannot be adjusted can be substituted with the elastic contact member 40 of which characteristic impedance is adjustable. Accordingly, impedance matching of the inspection contact structure 11 may be carried out accurately.

Moreover, in FIG. 4, although the contactor 43 of the elastic contact member 40 formed on the top surface of the ground conductor 12 is provided at a position facing the contactor 17 of the elastic contact member 13 formed on the bottom surface of the ground conductor 12, the position of the contactor 43 may be varied depending on the position of the connecting terminal 10a of the circuit board 10 without being limited to the example position in FIG. 4.

Figure 5:
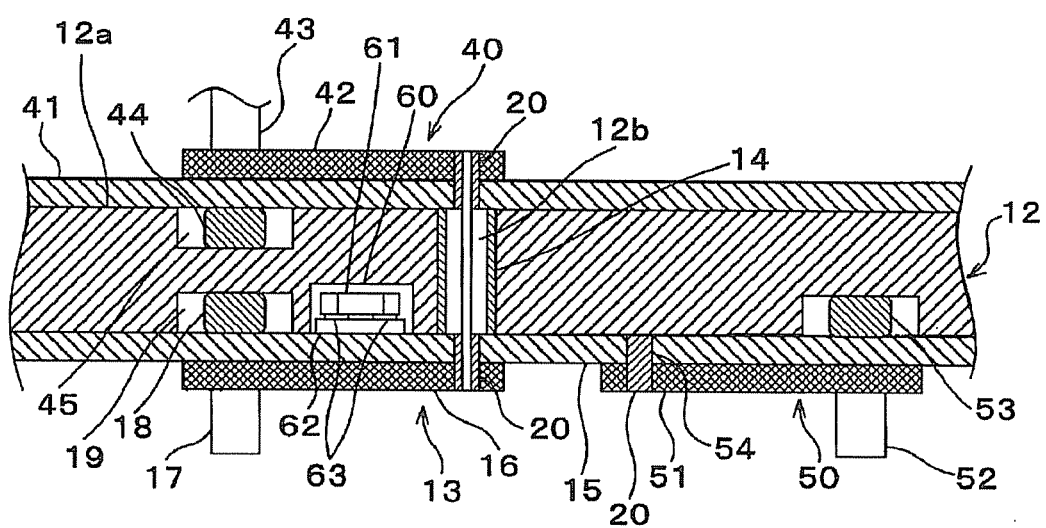
FIG. 5 is a side view illustrating a schematic configuration of an inspection contact structure in accordance with still another embodiment of the present invention.

Further, although the ground conductor 12 is a metallic substrate in the above-described embodiment, it may be prepared by bonding a sheet-shaped conductor to a surface of an insulator such as a glass substrate or a ceramic substrate, for example. Furthermore, the ground conductor 12 may be used for the grounding of the contact structure for inspection 11. In such a case, the ground conductor 12 may be electrically connected with an elastic contact member 50 for grounding provided on a bottom surface of the ground conductor 12, as depicted in FIG. 5.

The elastic contact member 50 may include the insulating layer 15, a wiring layer 51, a contactor 52 and an elastic body 53. In the present embodiment, the insulating layer 15 is shared by the elastic contact member 13 and the elastic contact member 50. However, a separate insulating layer may be provided for each of the elastic contact members. Here, since the configuration of the elastic contact member 50 is the same as that of the elastic contact member 13 described above, elaboration of the elastic contact member 50 is omitted. The elastic contact member 50 and the ground conductor 12 are electrically connected with each other by the conductor 20 through a connecting hole 54 passing through the insulating layer 15 in a vertical direction. With this configuration, a wiring for grounding of the elastic contact member 50 can be shortened, and the ground conductor 12 can be used as a frame ground of each elastic contact member 50. Thus, common grounding impedance can be reduced and noise of an inspection signal can also be reduced.

In the above-described embodiment, although the insulating layer 15 is made of an insulator, it may be made of a dielectric. In this case, a desired characteristic impedance can be achieved by employing a dielectric having a proper dielectric constant even in case that the desired characteristic impedance cannot be achieved just by adjusting the width of the wiring layer and the distance between the wiring layer 16 and the insulating layer 15.

Further, a recess 60 may be formed in a bottom surface of the ground conductor 12 and at a position between the contactor 17 and the through hole 12b, and a capacitor 61 for noise reduction may be provided in the recess 60. As depicted in FIG. 5, the capacitor 61 is provided on an insulating plate 62 placed on a top surface of the insulating layer 15 so as to bridge a wiring 63 formed on a top surface of the insulating plate 62. A non-illustrated through hole L is penetrated through the insulating plate 62 in a vertical direction. The wiring 63 is inserted through the through hole L and is electrically connected with the wiring layer 16 and the wiring layer 51 such that the capacitor 61 is connected with the wiring layer 16 and the wiring layer 51 in parallel. In this configuration, since the capacitor 61 can be placed in the vicinity of a leading end of the contactor 17, noise of an electrical signal for inspection in the vicinity of the leading end of the elastic contact member 13 can be removed. Accordingly, inspection accuracy can be further improved. Moreover, in this embodiment, although the capacitor 61 is provided on the insulating layer 15 via the insulating plate 62, the capacitor 61 may be provided on a bottom surface or a lateral surface of the recess 60.

There have been explained the embodiments of the present invention with reference to the accompanying drawings, but it is clear that the above-described embodiments are illustrative in all aspects and do not limit the present invention. It would be understood by those skilled in the art that various changes and modifications may be made without changing technical conception and essential features described in the following claims and their equivalents are included in the scope of the present invention. The present invention is not limited to the above-described embodiments, but various other embodiments can be taken. In the present invention, the inspection target object is not limited to a semiconductor substrate, but the inspection target object can be other substrate such as a flat panel display (FPD), a mask reticle for a photomask, or the like.

INDUSTRIAL APPLICABILITY

The present invention is applicable to a probe device that inspects an electrical characteristic of an inspection target object such as a semiconductor wafer.

What is claimed is:

1. A contact structure for inspection that is installed on a bottom surface of a circuit board and inspects an electrical characteristic of an inspection target object, the contact structure comprising:
    a ground conductor that is grounded;
    an elastic contact member that is brought into contact with the inspection target object; and
    a conductive line that electrically connects the circuit board and the elastic contact member,
    wherein the elastic contact member is provided on a bottom surface of the ground conductor, and
    the elastic contact member includes:
    a contactor that is brought into contact with the inspection target object,
    a wiring layer that electrically connects the contactor and the conductive line,
    an insulating layer that is provided between the wiring layer and the ground conductor, and
    an elastic body that is provided at a position facing the inspection target object via the contactor,
    wherein the wiring layer is provided in parallel with the ground conductor,
    the ground conductor and the wiring layer form a microstrip line with the insulating layer sandwiched therebetween, and
    a width of the wiring layer and a distance between the wiring layer and the ground conductor is set such that impedance matching of the entire contact structure including the elastic contact member is performed,
    wherein the ground conductor is provided with a cylindrical through hole formed in a vertical direction,
    the conductive line is accommodated within the cylindrical through hole coaxially with the cylindrical through hole,
    a cylindrical insulating layer is formed on an inner surface of the cylindrical through hole,
    the elastic body is configured to provide the contactor with elasticity via the microstrip line, and
    a thickness of the cylindrical insulating layer is smaller than a distance between an outer circumferential surface of the conductive line and an inner circumferential surface of the ground conductor within the cylindrical through hole.

2. The contact structure of claim 1, wherein the ground conductor is a metallic substrate.

3. The contact structure of claim 1, wherein another recess is formed in a bottom surface of the ground conductor, and
    a capacitor for noise reduction connected to the wiring layer is provided in the another recess.

4. The contact structure of claim 1, wherein the wiring layer of the elastic contact member is electrically connected with the ground conductor.

5. The contact structure of claim 1, wherein another elastic contact member is provided on a top surface of the ground conductor, the another elastic contact member including:
    another contactor that is brought into contact with the circuit board;
    another wiring layer that electrically connects the another contactor and the conductive line, and is provided in parallel with the ground conductor;
    another insulating layer that is provided between the another wiring layer and the ground conductor; and
    another elastic body that is provided at a position facing the circuit board via the another contactor,
    wherein the circuit board and the conductive line are electrically connected when the contactor of the another elastic contact member is brought into contact with the circuit board.

6. The contact structure of claim 5, wherein recesses are formed in a top surface and a bottom surface of the ground conductor, and at a position corresponding to the contactor and the another contactor, and
    the elastic body and the another elastic body are provided in each of the recesses, respectively.

7. The contact structure of claim 6, wherein a surface of the elastic body is covered with the insulating layer, and a surface of the another elastic body is covered with the another insulating layer.

* * * * *